United States Patent
Siebert et al.

(10) Patent No.: US 11,692,969 B2
(45) Date of Patent: Jul. 4, 2023

(54) APPARATUS AND METHOD FOR MEASURING MAGNETIC PROPERTIES OF A FERROMAGNETIC ENDLESS BELT

(71) Applicant: DR. BROCKHAUS MESSTECHNIK GMBH & CO. KG, Luedenscheid (DE)

(72) Inventors: Stefan Siebert, Oelde (DE); Piotr Klimczyk, Czestochowa (PL)

(73) Assignee: DR. BROCKHAUS MESSTECHNIK GMBH & CO. KG, Luedenscheid (DE)

( * ) Notice: Subject to any disclaimer, the term of this patent is extended or adjusted under 35 U.S.C. 154(b) by 91 days.

(21) Appl. No.: 16/838,686

(22) Filed: Apr. 2, 2020

(65) Prior Publication Data
US 2020/0326308 A1 Oct. 15, 2020

(30) Foreign Application Priority Data
Apr. 9, 2019 (DE) .......................... 102019109337.6

(51) Int. Cl.
*G01N 27/72* (2006.01)
*G01M 13/023* (2019.01)
(52) U.S. Cl.
CPC .......... *G01N 27/72* (2013.01); *G01M 13/023* (2013.01)
(58) Field of Classification Search
None
See application file for complete search history.

(56) References Cited

U.S. PATENT DOCUMENTS

| 3,281,678 | A | | 10/1966 | Cilyo | |
|---|---|---|---|---|---|
| 4,439,731 | A | * | 3/1984 | Harrison | G01N 27/82 324/239 |
| 5,426,362 | A | * | 6/1995 | Ninnis | G01N 27/82 340/676 |
| 5,929,634 | A | * | 7/1999 | Artinger | G01V 3/104 324/233 |
| 7,123,030 | B2 | * | 10/2006 | Robar | B66B 7/123 324/693 |
| 2004/0046540 | A1 | | 3/2004 | Robar et al. | |

(Continued)

FOREIGN PATENT DOCUMENTS

| DE | 2411565 C2 | 9/1975 |
|---|---|---|
| JP | 2008-151744 A | 7/2008 |

(Continued)

OTHER PUBLICATIONS

Office Action received for Japanese Patent Application No. 2020-068823, dated Apr. 4, 2023, 10 pages (5 pages of English Translation and 5 pages of Original Document).

*Primary Examiner* — Nasima Monsur
(74) *Attorney, Agent, or Firm* — Workman Nydegger

(57) ABSTRACT

An apparatus for determining magnetic properties of a portion of a magnetizable endless belt. The apparatus includes a primary coil for generating a magnetic field. The windings of the primary coil are wound around the endless belt. A secondary coil measures the magnetic flux density. A slotted yoke guides the magnetic flux. The endless belt extends through slots in the yoke. First measuring devices measure the magnetic field in a width portion parallel to the endless belt. Second measuring devices measure the magnetic field in the width portion parallel to the endless belt.

9 Claims, 4 Drawing Sheets

(56) References Cited

U.S. PATENT DOCUMENTS

2012/0168281 A1* 7/2012 Twigger ................ B65G 43/06
198/502.1
2016/0155282 A1 6/2016 Miura et al.

FOREIGN PATENT DOCUMENTS

| | | |
|---|---|---|
| JP | 2009-074813 A | 4/2009 |
| JP | 2010-204113 A | 9/2010 |
| JP | 2015-034794 A | 2/2015 |
| JP | 2018-124265 A | 8/2018 |

* cited by examiner

APPARATUS AND METHOD FOR MEASURING MAGNETIC PROPERTIES OF A FERROMAGNETIC ENDLESS BELT

CROSS-REFERENCE TO RELATED APPLICATIONS

The present invention claims the benefit of priority to German Patent Application No. 102019109337.6, filed Apr. 9, 2019, the entire content of which is incorporated by reference herein.

BACKGROUND OF THE INVENTION

1. The Field of the Invention

The invention relates to an apparatus and a method for determining the magnetic properties of a magnetizable endless belt, in particular a steel belt, the device having a coil for generating a magnetic field and coils for measuring.

2. Background and Relevant Art

Transformer cores as well as stators and other iron cores consist of a large number of layers of soft magnetic sheet metal, so-called sheet iron or sheet steel, which are electrically insulated from one another.

The individual sheets of such a core made of laminated iron are typically produced from punched or cut individual sheets, the individual sheets being punched from a steel strip or cut by means of longitudinal and transverse parts. The properties of the core therefore depend on the magnetic properties of the sheets, provided that the individual sheets are electrically insulated from one another. An important magnetic parameter is thereby the total power loss that occurs in the sheet when it is excited by alternating magnetic fields.

Such electrical steel strips are typically produced and supplied in rolls, so-called coils, and are also referred to as endless belt. The magnetic properties of the endless belt are not identical everywhere in the belt, but areas can differ considerably from one another.

Accordingly, it is desirable to measure the magnetic properties of such an endless belt made of ferromagnetic material in a non-destructive manner, so that the magnetic properties of the endless belt are known and the areas of such an endless belt can be processed in accordance with their respective magnetic properties.

Conventional apparatuses for measuring the magnetic properties of such an endless belt collectively measure the measured values of the magnetic properties of an endless belt over the entire width of the belt.

U.S. Pat. No. 3,281,678 describes an apparatus in which an endless belt extends through an apparatus. The endless belt extends through an excitation coil and a measuring coil, which measure over the entire width of the endless belt. A plurality of measuring coils arranged next to one another in the width of the endless belt, so-called field coils or H coils, measure the magnetic properties of the endless belt only collectively over the width. For the measurement of the loss of magnetization of the endless belt, a defined magnetic flux density B is generated in the belt by means of the excitation coil, the magnetic field H is measured with the H coils, and the magnetic loss can be determined in a known manner from the measured B values and H values.

DE 24 11 565 C2 describes an apparatus for the continuous measuring of the magnetic properties of an endless belt made of ferromagnetic material over the entire width of the endless belt. The apparatus comprises an excitation coil for generating a magnetic field, the winding of which extends over the entire width of the endless belt. A measuring coil is arranged inside the excitation coil and coaxially with the excitation coil for the measurement of the magnetic flux which is induced in the endless belt when said belt is magnetically excited by an alternating current in the excitation coil. Furthermore, the apparatus comprises at least two yokes, which extend around the excitation coil, have air gaps for the passage of the endless belt, and which complete the magnetic circuit. The at least two yokes are arranged at a distance from one another. Each yoke consists of a large number of yoke strips that are insulated from one another and arranged side by side. The spaced arrangement of the two yokes and the subdivision of the yokes into respective strips causes a subdivision of the eddy currents generated in the endless belt and thus reduces eddy current losses in the endless belt during the measurement and increases the measurement accuracy when measuring the losses.

On the basis of this prior art, an apparatus for continuous measurement, a so-called inline measurement, of an endless belt is desirable, which in particular results in the loss power in the case of an alternating field excitation with the highest possible local resolution over the width of the endless belt.

BRIEF SUMMARY OF THE INVENTION

The apparatus described below and the corresponding method allow such a continuous measurement of the magnetic loss power of an endless belt with a high local resolution over the width of the endless belt.

DETAILED DESCRIPTION OF THE PREFERRED EMBODIMENTS

Figure 1:
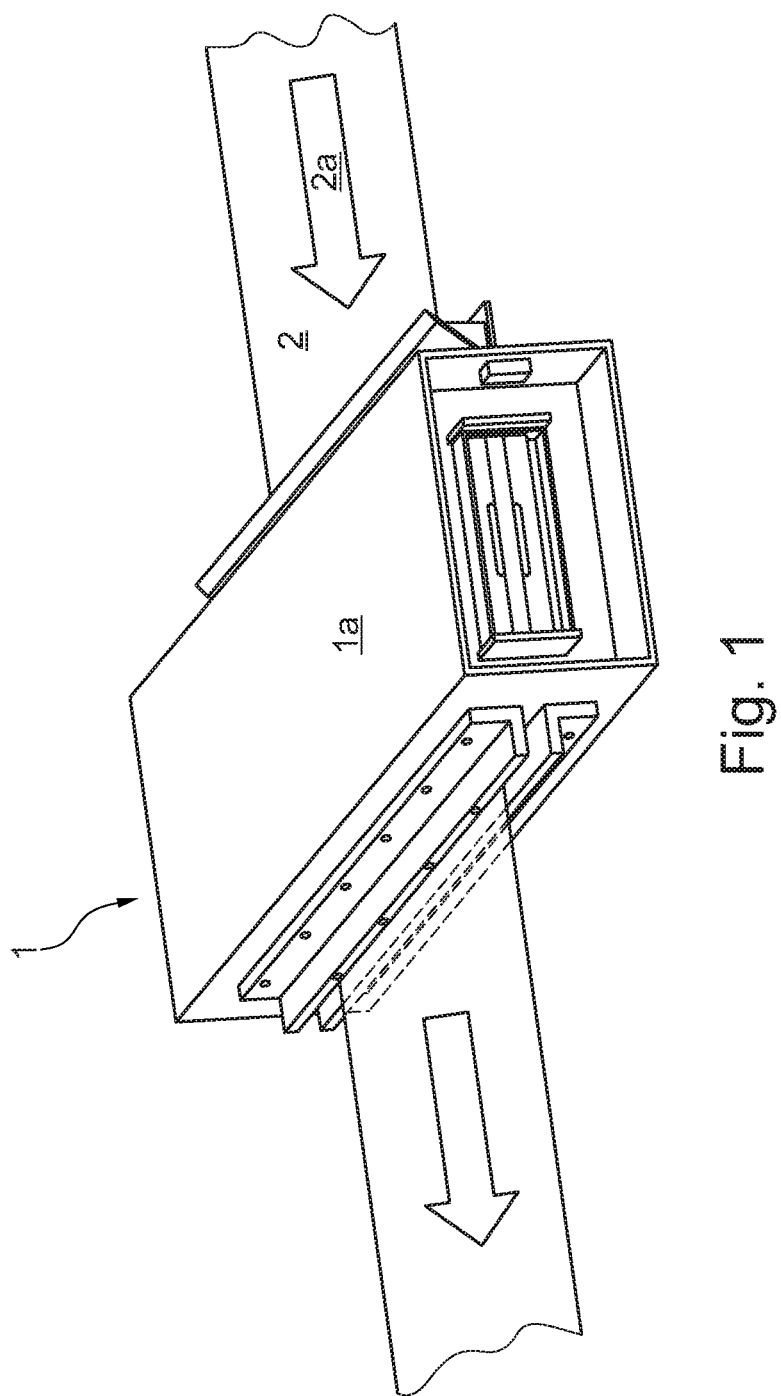
FIG. 1 is a perspective view of an apparatus for determining the magnetic properties of a ferromagnetic endless belt.

In the figures described below, the same reference numerals designate the same elements of the schematically illustrated apparatus. The figures are neither to scale nor do they show all the details; they only serve to illustrate various arrangements of the apparatus. The figures show schematic views of the apparatus, substantially showing the arrangement of the excitation coil and the sensors or measuring coils. For the sake of clarity, the elements of the electrics and electronics for triggering the excitation coil and the electronics for evaluating the signals from the sensors or measuring coils are not shown, since the structure and the triggering result from the following for the person skilled in the art.

In the embodiment of the invention described below, the field coils are arranged above and below the endless belt in order to be able to compensate for fluctuations in the distance between a coil and the endless belt by means of averaging. In alternative embodiments, corresponding coils can only be arranged above or below the endless belt if the distance between the endless belt and the coil is known and constant. Likewise, in the embodiment described below, the probe coils are arranged above and below the endless belt in order to detect the entire magnetic flux that passes from the endless belt into the yoke. In alternative embodiments, the probe coils can only be arranged above or below the endless belt, provided that the respective magnetic flux can be determined with sufficient accuracy for symmetry or other reasons.

FIG. 1 shows a schematic perspective view of the apparatus 1 for measuring the magnetic properties of an endless belt 2. The apparatus comprises a housing 1a having an inlet and an outlet side, on each of which a slot-shaped opening is placed. During operation, the endless belt 2 runs into the apparatus on the inlet side and accordingly leaves the apparatus on the outlet side, the endless belt being moved continuously through the device, as indicated by the arrow 2a. The magnetic properties of the endless belt can be measured continuously while passing through the endless belt. In this way, the apparatus can be used "in line" in a production line.

Figure 2:
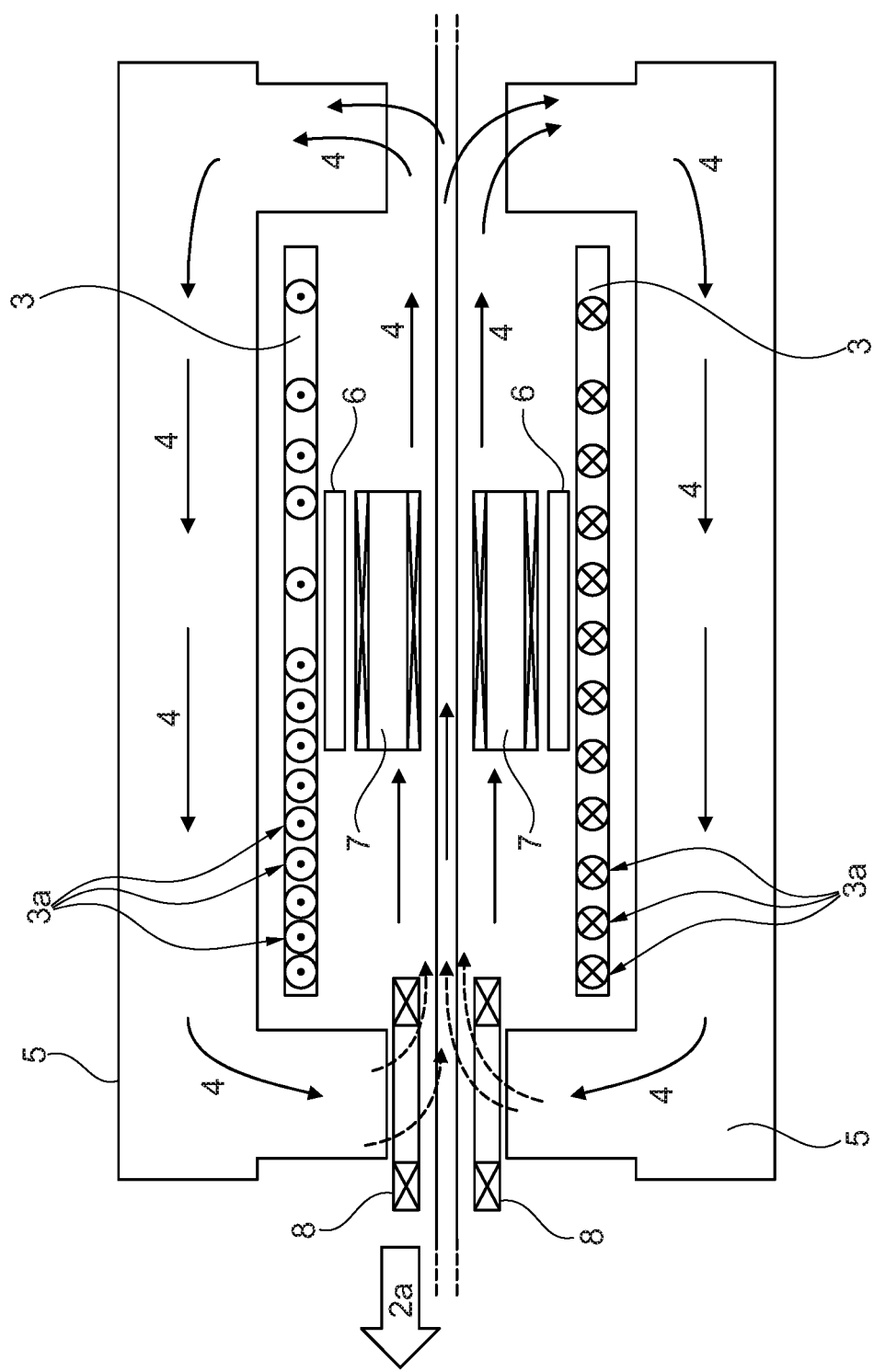
FIG. 2 is a schematic view of a section through such an apparatus.

FIG. 2 shows a schematic view of a section through such an apparatus in the direction of travel 2a of the endless belt 2, only the substantial coils or sensors of the apparatus being shown. The housing 1a is not shown in this figure.

The ferromagnetic endless belt 2, the magnetic properties of which, in particular the losses during remagnetization, are to be measured, extends through the apparatus and is moved in the direction of the arrow 2a.

The apparatus comprises an excitation coil 3, also referred to in such systems as a primary coil, wherein the windings 3a thereof and a current direction of the excitation current are drawn. It should be noted that the excitation current typically has a frequency of 50 Hz to 400 Hz, in particular 50 Hz or 60 Hz. Accordingly, the excitation coil 3 generates the field represented by the arrows 4 for the moment shown. The winding of the excitation coil 3 is guided around the endless belt, so that a width of the endless belt lies in the magnetic field 4. The direction of the generated magnetic field 4 changes between parallel and anti-parallel to the direction of movement of the endless belt.

The apparatus 1 comprises a slotted yoke 5 for guiding the magnetic field 4, the slots of the yoke 5 being arranged on the inlet and outlet sides of the device and the endless belt extending through the slots of the yoke 5. In FIG. 2, a part of the yoke 5 is accordingly arranged below the endless belt 2, the other part of the yoke 5 above the endless belt 2.

The generated magnetic field 4 thus runs through the yoke 5 and therebetween through the endless belt 2 or parallel to it through the air.

Furthermore, the apparatus comprises a secondary coil 6, the winding of which extends coaxially to the winding of the excitation coil 3 and, like the excitation coil 3, around the entire width of the endless belt 2, that is to say encompasses the endless belt, and the secondary coil 6 is arranged within the excitation coil 3. Furthermore, the secondary coil 6 is ideally arranged within the excitation coil 3 such that the entire magnetic field passes through the secondary coil 6, so that the magnetic flux in the endless belt can be measured with the secondary coil 6. In one embodiment, the secondary coil 6 is arranged within the excitation coil 3 and having an insulating layer in the immediate vicinity of the winding of the coil 3. In this way, the secondary coil 6 allows the measurement of the entire magnetic flux.

In addition, the apparatus 1 has a plurality of so-called field coils 7 and a corresponding plurality of so-called probe coils 8, so-called pick-up coils, a pair of field coils 7 being assigned a correspondingly placed pair of probe coils 8.

The apparatus makes it possible to measure the power losses during remagnetization in different segments, which are placed next to one another in the direction of movement of the endless belt, so that the magnetic properties are not measured over the entire width of the endless belt, but in narrower segments. The width of the endless belt is metrologically subdivided into a plurality of portions lying next to one another, each having a respective width. In this way, an endless belt can be metrologically divided into a plurality of segments, the length of which is predetermined by the length of the measuring device and the width of which is a portion of the total width, as explained below.

The total width of the endless belt, which typically has a width of 0.9-2 m, is metrologically subdivided into width portions. The width of the plurality of portions can be identical or different from one another. Width portions which lie on the edge of the endless belt can be considerably narrower than those in the middle, for example in order to be able to take edge effects into account better.

The field coils 7 are arranged in pairs above and below the endless belt and for measuring the magnetic field parallel to the surface of the endless belt, a pair of field coils for measuring the magnetic field being provided on a segment, that is to say for a width portion. The field coils are oriented parallel to the direction of the excitation coil 3. In this case, a plurality of field coils 7 are arranged next to one another in the direction of the belt and are arranged such that the field strength of the magnetic field is measured over the entire width of the endless belt 2. The pairs of field coils 7 arranged above and below the endless belt each detect the magnetic field strength in the same width, the width of the field coils being that of the segment, that is to say the width portion of the segment. In the further description, the width of a respective field coil is equated with the width of the measurement of the segment. In alternative embodiments, the magnetic field strength can be measured using other measuring means, for example Hall sensors or magnetometers.

The apparatus 1 further comprises probe coils 8, also called pick-up coils, for measuring the magnetic flux which enters the yoke 5 from the endless belt 2 in a width portion. The probe coils 8 are arranged in an air gap or slot of the yoke 5. The probe coils 8 have a width for detecting the magnetic flux in such a width portion, the width corresponding to that of a field coil which contains the magn. field in the corresponding width. In the following, the width of a probe coil is equated with the width of the measurement of a segment. A probe coil 8 thus measures the magnetic flux of a width portion to which a pair of field coils has measured the magnetic field strength, so the coils or corresponding measuring devices are each of the same width. For each width portion, a probe coil 8 is preferably arranged above the endless belt and a probe coil 8 below the endless belt, which detect the magnetic flux of the same width of the endless belt 2 in the width portion. The total magnetic flux of such a width portion or segment of the endless belt is the sum of the coils of a pair of probe coils placed above or below the endless belt.

In alternative embodiments, a probe coil 8 as well as a field coil 7 can be replaced by another measuring device, for example by a Hall probe. The measuring device 8 for measuring the magnetic flux can optionally be placed at the inlet or outlet end of the apparatus 1.

The field coils 7 and probe coils 8 are each assigned to one another in pairs in the width of the endless belt 2, so that a pair of field coils 7 detects the field strength in a width portion of the endless belt and an assigned pair of probe coils 8 measures the magnetic flux which emerges from the endless belt into the iron core, in the same width portion.

In this way, a pair of field coils 7 and a pair of probe coils 8, which are arranged in the same width portion of the endless belt, detect the magnetic field strength parallel to the endless belt and the magnetic flux in the same width portion of the endless belt 2, that is to say in a segment of the endless belt, and thus allow the calculation of the hysteresis and thus the loss value in the segment.

The correlated power loss CPL of a segment of the endless belt can be determined by the measured field strength H and flux density B. The field strength measurement consists of upper and lower field coils 7. The field strength measured above the endless belt in a segment is referred to below as Ho, the field strength measured below the endless belt is referred to as Hu. The measurement of the magnetic flux density of a segment is carried out with the probe coils 8, the flux density measured in the segment above the endless belt subsequently being referred to as Bo and the flux density measured in the segment below the endless belt being referred to as Bu.

The field strength of a segment is determined as follows:

First, the field strengths in a segment above and below the endless belt are determined with the field coils 7, wherein $$H_o = \frac{1}{N*A*\mu_0} \int_0^\tau u_{Ho}(t)dt$$

$$H_u = \frac{1}{N*A*\mu_0} \int_0^\tau u_{Hu}(t)dt$$

N: Number of windings
A: cross-sectional area traversed by the magnetic flux
$\mu_0$: magnetic field constant
$u_{Ho}$: induced voltage in the upper field coil
$u_{Hu}$: induced voltage in the lower field coil The mean value of the field strengths Hu and Ho is then calculated, it being assumed that the distance from the upper and lower field coils to the material surface is the same. Because the apparatus fulfills this assumption, the mean field strength $H_{Medium}$ can be calculated $$H_{Medium} = \frac{H_o + H_u}{2}$$

The resulting field strength HSegment averaged for a respective segment of the endless belt is obtained by multiplication by a calibration factor k, which adapts the mean value of the field coils 7 to the field strength generated by the primary coil 3.

$$H_{Segment} = k_i * H_{Medium}$$

The flux density in a segment is determined similarly. Since the magnetic flux for a segment results from the sum of the partial fluxes or through the upper or lower probe coil, the voltages induced in the probe coils 8 are first added in pairs.

$$u_B(t) = u_{Bo}(t) + u_{Bu}(t)$$

This results in the magnetic flux $\Phi_B$ for a segment $$\Phi_B = \int_0^\tau u_B(t)dt$$

The measured magnetic flux $\Phi_B$ is now correlated in segments with the measured total flux density, which was measured by means of the secondary coil 6. The correlation factor $n_i$ adjusts the flux density $\Phi_B$ determined for a segment to the total flux density, so that:

$$B_{Segment} = n_i * \frac{\Phi_B}{N*A}$$

having
N: Number of windings of the probe coil 8
A: cross-sectional area traversed by the magnetic flux in the segment of the endless belt The power loss can now be determined from the $H_{Segment}$ and $B_{segment}$ values determined for a segment:

$$P = \frac{f}{\rho} \int_0^T H_{Segment}(t) * \frac{dB_{Segment}(t)}{dt} dt$$

f: Frequency of the field of excitation
$\rho$: Average density of the endless belt
T: Period of the field of excitation The power loss of a segment of the endless belt is thus determined from the measured flux density B and the measured field strength H of the width portion.

To carry out the calculation of the power loss in a segment, the apparatus comprises appropriate measuring transducers for converting the measured voltages/currents into digital signals and a digital signal processing device. The digitized measured values are fed to the digital signal processing, which determines the power loss values for a respective segment based on the digitized measured values and using a suitable computer program. The determined power loss values can be prepared and displayed in a graphic representation.

Figure 3:
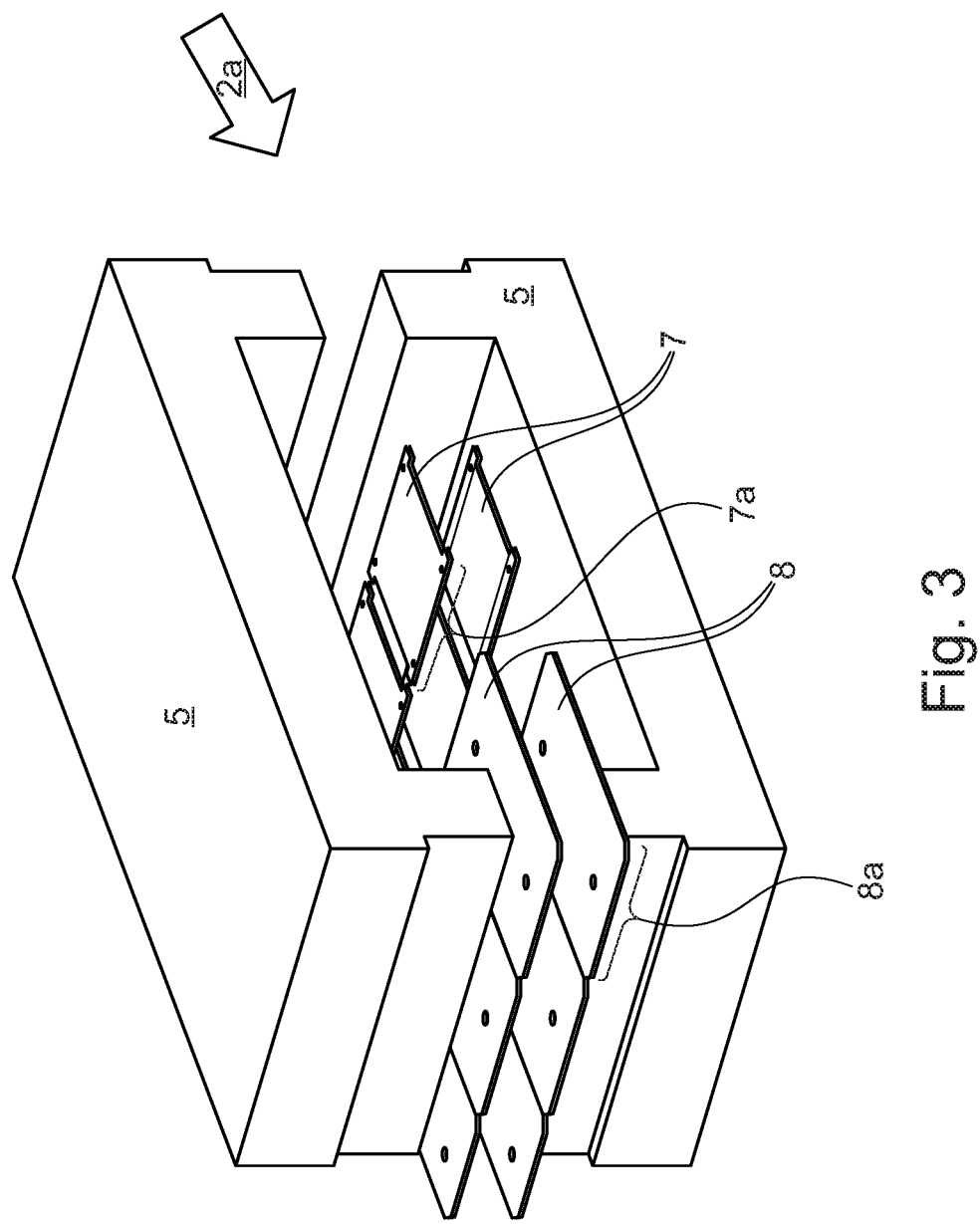
FIG. 3 is a schematic representation of a first arrangement of measuring devices for determining the magnetic field or the magnetic flux.

FIG. 3 shows a schematic arrangement of field coils 7 or corresponding measuring devices for measuring the magnetic field and of probe coils 8 or corresponding measuring devices for measuring the magnetic flux in an endless belt 2 into the yoke 5. The endless belt 2 and the primary excitation coil 3, the secondary coil 6 for measuring the entire magnetic field are not shown in FIG. 3. The arrow 2a indicates the direction in which the endless belt extends through the first and second slot of the yoke 5.

The measuring devices 7 for measuring the magnetic field above and below the endless belt have a width 7a, the width of the measuring device 7 which is arranged above the endless belt (not shown) corresponding to that of the measuring device which is arranged below the endless belt. Likewise, the measuring devices 8 for measuring the magnetic flux which passes from the endless belt into the iron core 5 have a width 8a, the width of a measuring device arranged above the endless belt also corresponding to that which is arranged in the width portion below the endless belt.

The width 7a or 8a of a portion of the endless belt whose magnetic properties are measured is determined by the width of the measuring devices 7 or the identical width of the measuring devices 8, i.e. the width of the measuring device, so that the measuring devices 7 and 8 determine the field strength or determine the magnetic flux for a width portion. FIG. 3 thus shows a design in which a length portion of the endless belt 2, which is in the apparatus at the time of the measurement, is metrologically subdivided into three width portions arranged side by side.

Figure 4A:
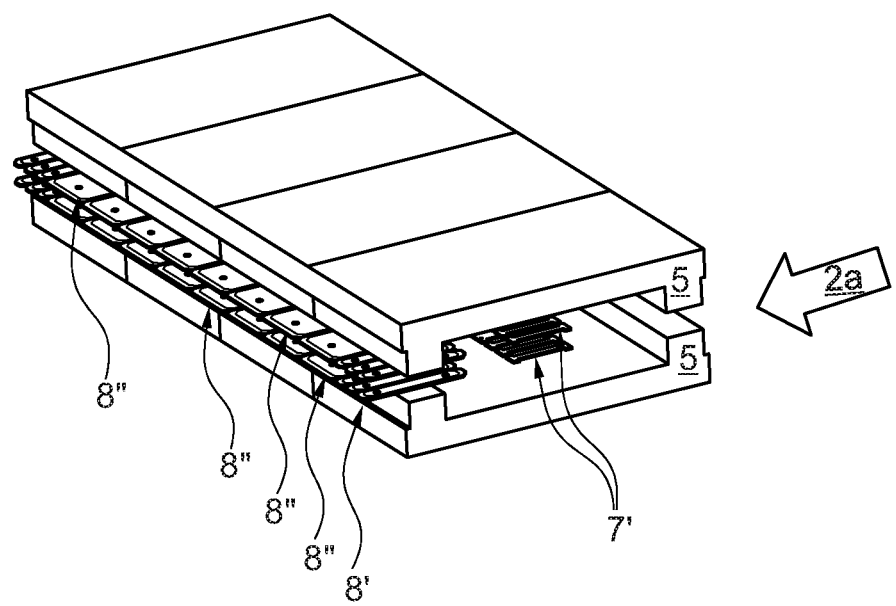
FIGS. 4a, 4b are a schematic representation of a further arrangement of measuring devices for determining the magnetic field or the magnetic flux.

FIG. 4a shows a schematic perspective view of a further arrangement of measuring devices 7 and 8, which are arranged within a yoke 5 or in an air gap/slot of the yoke. As in FIG. 3 described above, neither the endless belt 2 nor the primary excitation coil are shown.

Figure 4B:
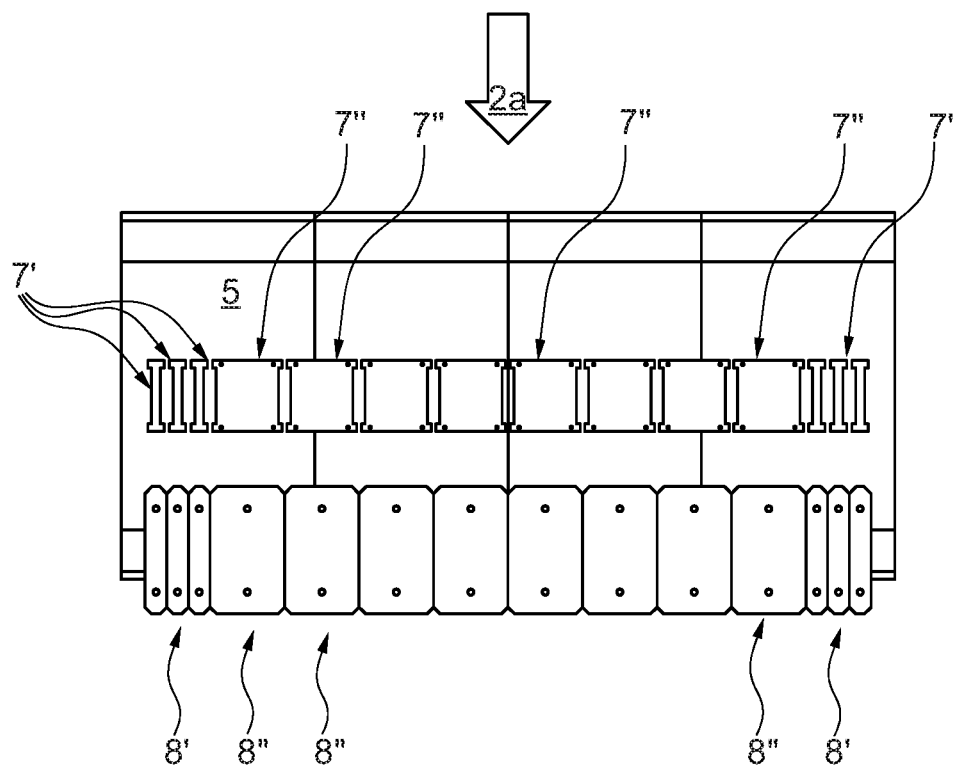

FIG. 4b shows a schematic top view of an arrangement of measuring devices 7 for measuring the magn. field parallel to the endless belt and a corresponding arrangement of measuring devices, probe coils 8, for measuring the magn. flux that passes from the endless belt into a yoke 5, the upper leg of the yoke 5 not being shown in FIG. 4b to illustrate the arrangement of the measuring devices. As shown schematically here, the yoke 5 can consist of a plurality of partial yokes arranged side by side in the band direction.

The direction of movement of the endless belt is again indicated by the arrow 2a. The arrangement of the measuring devices shows that the three measuring devices 7' each placed on the edge of the endless belt or on one edge of the yoke 5 have a smaller measuring width than the centrally arranged 8 measuring devices 7". Likewise, the probe coils 8' arranged at the edge of the endless belt or at an edge of the yoke 5 have a correspondingly smaller width than the 8 probe coils 8" arranged in the center. The measuring width of the measuring devices 7 of a width portion corresponds to that of a measuring device 8 again, so that the magnetic properties of a width portion of the endless belt can be determined by means of a pair of measuring devices 7 and a pair of measuring devices 8, in this embodiment for the detection of the magnetic properties of a length portion of the endless belt, a total of 14 pairs of measuring devices 7, for example field coils, and correspondingly 14 pairs of measuring devices 8, for example probe coils, are used, wherein respectively three pairs of field coils 7' and respectively three pairs of probe coils 8' on each edge have a smaller width than corresponding field coil pairs 7" or probe coils 8", which are arranged further in the center. This arrangement thus enables a more finely resolved determination of the magnetic properties in the edge areas of the endless belt.

If conventional apparatuses for determining the magnetic properties of a ferromagnetic endless belt have a yoke 5 as well as an excitation coil 3 and a secondary coil 6 for determining the total magnetic field and the space conditions in the apparatus are appropriately provided, measuring devices 7 for determining the magnetic field can be arranged in parallel to the endless belt, i.e. for example field coils 7, and corresponding probe coils 8 can be arranged for measuring the magnetic flux from the endless belt into the yoke.

LIST OF REFERENCE NUMERALS

1 apparatus for measuring magnetic properties
1a housing
2 endless belt
2a direction of movement of the endless belt
3 excitation coil, primary coil
4 magn. field
5 yoke
6 secondary coil
7 field coil, measuring device
7a width=measuring width of the field coil
7' field coil, measuring device in the edge area
7" field coil, measuring device in the central area
8 probe coil, measuring device
8a width=measuring width of the probe coil 8
8' probe coil, measuring device in the edge area
8" probe coil, measuring device in the central area

We claim:

1. An apparatus for determining magnetic properties of a magnetizable endless belt, comprising:
   a primary coil for generating a magnetic field, wherein windings of the primary coil are wound around the endless belt, wherein the magnetic field generated by the primary coil is parallel to the endless belt, and
   a secondary coil for measuring a magnetic flux density, wherein windings of the secondary coil are wound around the endless belt, and
   a slotted yoke for guiding the magnetic flux, wherein the endless belt extends through slots in the yoke,
   a first plurality of measuring devices for measuring the magnetic field in a respective width portion parallel to the endless belt, and
   a second plurality of measuring devices for measuring a magnetic flux in the respective width portion of the endless belt,
   wherein the primary coil is enclosed within the slotted yoke and the secondary coil and the first plurality of measurement devices for measuring the magnetic field are enclosed within the primary coil.

2. The apparatus according to claim 1, wherein the first and the second plurality of measuring devices measure in at least two width portions, preferably in more than five and particularly preferably in 14 width portions.

3. The apparatus according to claim 1, wherein the first plurality of measuring devices for measuring the magnetic field in a width portion are arranged above and below the endless belt.

4. The apparatus according to claim 1, wherein the second plurality of measuring devices for measuring the magnetic flux density are arranged in a width portion above and below the endless belt.

5. The apparatus according to claim 1, wherein the first plurality of measuring devices arranged on the edge of the endless belt detect a smaller portion width than the second plurality of measuring devices arranged centrally.

6. A method for determining magnetic properties of a width portion of a magnetizable endless belt, comprising:
   generating a magnetic field, which is parallel to the endless belt and spans the width of the endless belt, wherein the magnetic field is generated by a primary coil, windings of the primary coil being wound around the endless belt, and
   determining a total magnetic field generated by use of a secondary coil, windings of the secondary coil being wound around the endless belt, and
   determining by a first plurality of measuring devices the magnetic field in the width portion parallel to the surface of the endless belt, and
   determining by a second plurality of measuring devices a magnetic flux which passes from the width portion of the endless belt into a slotted yoke, and
   determining a magnetic property of the width portion of the endless belt based on the determined total magnetic field and a magnetic flux density in the width portion and the magnetic field of the width portion,
   wherein the magnetic flux density is measured by the secondary coil;

wherein the primary coil is enclosed within the slotted yoke and the secondary coil and the first plurality of measurement devices for measuring the magnetic field are enclosed within the primary coil.

7. The method according to claim 6, wherein a total width of the endless belt is metrologically divided into at least three width portions, preferably in more than five and particularly preferably in 14 width portions.

8. The method according to claim 6, wherein the endless belt is continuously moved.

9. The method according to claim 6, wherein the magnetic field is measured in the width portion above and below the endless belt.

* * * * *